United States Patent
Chen et al.

(10) Patent No.: US 9,144,174 B2
(45) Date of Patent: Sep. 22, 2015

(54) CABLE MANAGEMENT ARM ASSEMBLY

(71) Applicant: KING SLIDE WORKS CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/200,357

(22) Filed: Mar. 7, 2014

(65) Prior Publication Data
US 2014/0183306 A1 Jul. 3, 2014

Related U.S. Application Data

(63) Continuation-in-part of application No. 13/858,427, filed on Apr. 8, 2013, which is a continuation-in-part of application No. 13/707,837, filed on Dec. 7, 2012.

(51) Int. Cl.
*A47F 7/00* (2006.01)
*H05K 7/14* (2006.01)

(52) U.S. Cl.
CPC ............ *H05K 7/1491* (2013.01); *H05K 7/1421* (2013.01)

(58) Field of Classification Search
CPC ..... H05K 7/02; H05K 7/1421; H05K 7/1491; F16L 3/00; F16L 3/01; F16L 3/015; F16L 3/02; F16L 3/06
USPC ............... 211/26; 174/68.3; 248/70; 361/747
See application file for complete search history.

(56) References Cited

U.S. PATENT DOCUMENTS

| | | | |
|---|---|---|---|
| 7,472,795 B2 | 1/2009 | Dubon et al. | |
| 7,554,819 B2 | 6/2009 | Chen et al. | |
| 7,654,398 B2 | 2/2010 | Bridges et al. | |
| 7,712,615 B2 | 5/2010 | Chen et al. | |
| 7,746,667 B1 | 6/2010 | Baiza et al. | |
| 8,231,014 B2 | 7/2012 | Chen et al. | |
| 8,251,321 B2 * | 8/2012 | Chen et al. | 248/70 |
| 2006/0081736 A1 * | 4/2006 | Chen et al. | 248/68.1 |
| 2006/0113433 A1 * | 6/2006 | Chen et al. | 248/70 |
| 2008/0164789 A1 * | 7/2008 | Williams | 312/223.1 |
| 2009/0014601 A1 * | 1/2009 | Chen et al. | 248/70 |
| 2009/0065658 A1 * | 3/2009 | Chen et al. | 248/70 |
| 2010/0193646 A1 * | 8/2010 | Chen et al. | 248/70 |
| 2011/0180297 A1 * | 7/2011 | Yu et al. | 174/69 |

* cited by examiner

*Primary Examiner* — Korie H Chan
(74) *Attorney, Agent, or Firm* — Rosenberg, Klein & Lee

(57) ABSTRACT

A cable management arm assembly includes first and second arms, a cable base pivotally connected between the arms, a plate fixedly connected to the cable base, a supporting base, first and second supporting members, and a sliding base connected to the plate and slidably connected to the second supporting member. The second supporting member is movably connected to the first supporting member, which is pivotally connected to the supporting base. When the second arm is moved away from the first arm, the cable base is moved away from the supporting base, and the sliding base drives the second supporting member to extend from the first supporting member and the first supporting member to rotate relative to the supporting base (16).

8 Claims, 9 Drawing Sheets

CABLE MANAGEMENT ARM ASSEMBLY

CROSS-REFERENCE TO RELATED APPLICATIONS

This application is a Continuation-in-Part of U.S. patent application Ser. No. 13/858,427 filed Apr. 8, 2013, currently pending, which is a Continuation-in-Part of U.S. patent application Ser. No. 13/707,837 filed Dec. 7, 2012, currently pending. The contents of the aforementioned applications are incorporated herein by reference.

FIELD OF THE INVENTION

The present invention relates to a cable management arm assembly and more particularly to a supporting structure for cable management.

BACKGROUND OF THE INVENTION

The supporting structure of cable management arms has been disclosed in U.S. Pat. No. 7,472,795 B2, granted to Dubon et al.; U.S. Pat. No. 7,654,398 B2, granted to Bridges et al.; U.S. Pat. No. 7,746,667 B1, granted to Baiza et al.; and U.S. Pat. Nos. 7,554,819 B2; 7,712,615 B2; 8,231,014 B2; and 8,251,321 B2, granted to Chen et al. The above-mentioned patents are incorporated herein by reference.

However, the foregoing supporting structures for cable management arms leave room for improvement especially in terms of the convenience of installation and use. In view of this, the inventor of the present invention envisioned designing a more simple supporting structure.

SUMMARY OF THE INVENTION

The present invention relates to a cable management arm assembly. More particularly, the present invention relates to a structurally simple design for holding, managing, and securely supporting cables.

According to one aspect of the present invention, a cable management arm assembly includes: a first arm; a second arm; a cable base pivotally connected between the first arm and the second arm; a plate fixedly connected to the bottom of the cable base; a supporting base; a first connecting unit connected to the first arm; a second connecting unit connected to the second arm; a third connecting unit connected to the supporting base; a first supporting member pivotally connected to the supporting base and abutting against the supporting base; a second supporting member movably connected to the first supporting member and extensible/retractable relative to the first supporting member; and a sliding base connected to the plate and movably connected to the second supporting member. The first arm is mounted at a fixed first predetermined position via the first connecting unit. The second arm is mounted at a variable second predetermined position via the second connecting unit. The supporting base is mounted at a fixed third predetermined position via the third connecting unit. When the second connecting unit of the second arm is displaced away from the first connecting unit of the first arm, the cable base is moved away from the supporting base due to the sliding base sliding on the second supporting member, and the sliding base drives the second supporting member to extend relative to the first supporting member and drives the first supporting member to rotate relative to the supporting base.

Preferably, the cable management arm assembly further includes an elastic element connected between the first supporting member and the second supporting member so that the second supporting member can be elastically pulled relative to the first supporting member by the elastic element.

Preferably, the second supporting member has a first stop block and a second stop block, both corresponding in position to the sliding base so that the sliding base can slide between the first stop block and the second stop block. Once stopped at the first stop block, the sliding base drives the second supporting member to displace relative to the first supporting member.

Preferably, the first supporting member has a first hook, the second supporting member has a second hook, and the elastic element is connected to the first hook and the second hook.

Preferably, the supporting base has a first supporting portion and a second supporting portion substantially perpendicular to the first supporting portion. The third connecting unit is pivotally connected to the first supporting portion, and the first supporting member is pivotally connected to the second supporting portion.

Preferably, the first supporting portion of the supporting base has a first projection and a second projection, and the third connecting unit has a first positioning hole and a second positioning hole. When the third connecting unit is rotated in a first direction relative to the supporting base to a first position, the first projection of the third connecting unit is engaged in the first positioning hole such that the third connecting unit is fixed in position. When the third connecting unit is rotated in a second direction relative to the supporting base to a second position, the second projection of the third connecting unit is engaged in the second positioning hole such that the third connecting unit is fixed in position.

Preferably, the plate has a curved sliding groove, and the sliding base is connected to the curved sliding groove via a first connecting element so as to rotate relative to the plate in a limited manner.

Preferably, the cable management arm assembly further includes: a first slide rail assembly at least including a first fixed rail and a first movable rail longitudinally and slidably displaceable relative to the first fixed rail; and a second slide rail assembly at least including a second fixed rail and a second movable rail longitudinally and slidably displaceable relative to the second fixed rail. The first connecting unit is mounted on the first fixed rail of the first slide rail assembly and is thereby fixed at the first predetermined position. The second connecting unit is mounted on the first movable rail of the first slide rail assembly and is thus located at the second predetermined position, wherein the second predetermined position is variable in response to sliding of the first movable rail relative to the first fixed rail. The third connecting unit is mounted on the second fixed rail of the second slide rail assembly and is thereby fixed at the third predetermined position.

According to another aspect of the present invention, a cable management system of the present invention includes a first slide rail assembly, a second slide rail assembly, a first arm, a second arm, a cable base, a supporting base, a first supporting member, a second supporting member, an elastic element, and a sliding base. The first slide rail assembly at least includes a first fixed rail and a first movable rail. The first movable rail can be longitudinally and slidably displaced relative to the first fixed rail. The second slide rail assembly at least includes a second fixed rail and a second movable rail. The second movable rail can be longitudinally and slidably displaced relative to the second fixed rail. The first arm is connected to the first fixed rail of the first slide rail assembly. The second arm is connected to the first movable rail of the first slide rail assembly. The cable base is pivotally connected between the first arm and the second arm. The supporting base is connected to the second fixed rail of the second slide rail assembly. The first supporting member is pivotally connected to the supporting base and abuts against the supporting base. The second supporting member is slidably connected to the first supporting member. The elastic element is connected between the first supporting member and the second supporting member. The sliding base is pivotally connected to the cable base and is slidably connected to the second supporting member. When the first slide rail assembly and the second slide rail assembly are extended, the second arm is displaced away from the first arm, the sliding base moves away from the supporting base by sliding on the second supporting member, and the sliding base drives the second supporting member to extend from the first supporting member and drives the first supporting member to rotate relative to the supporting base. When the first slide rail assembly and the second slide rail assembly are retracted, the second arm is brought close to the first arm, and the second supporting member is displaced relative to the first supporting member in response to the elastic force generated by the elastic element.

BRIEF DESCRIPTION OF THE DRAWINGS

The invention as well as a preferred mode of use and the advantages thereof will be best understood by referring to the following detailed description of some illustrative embodiments in conjunction with the accompanying drawings, wherein.

DETAILED DESCRIPTION OF THE INVENTION

Figure 1:
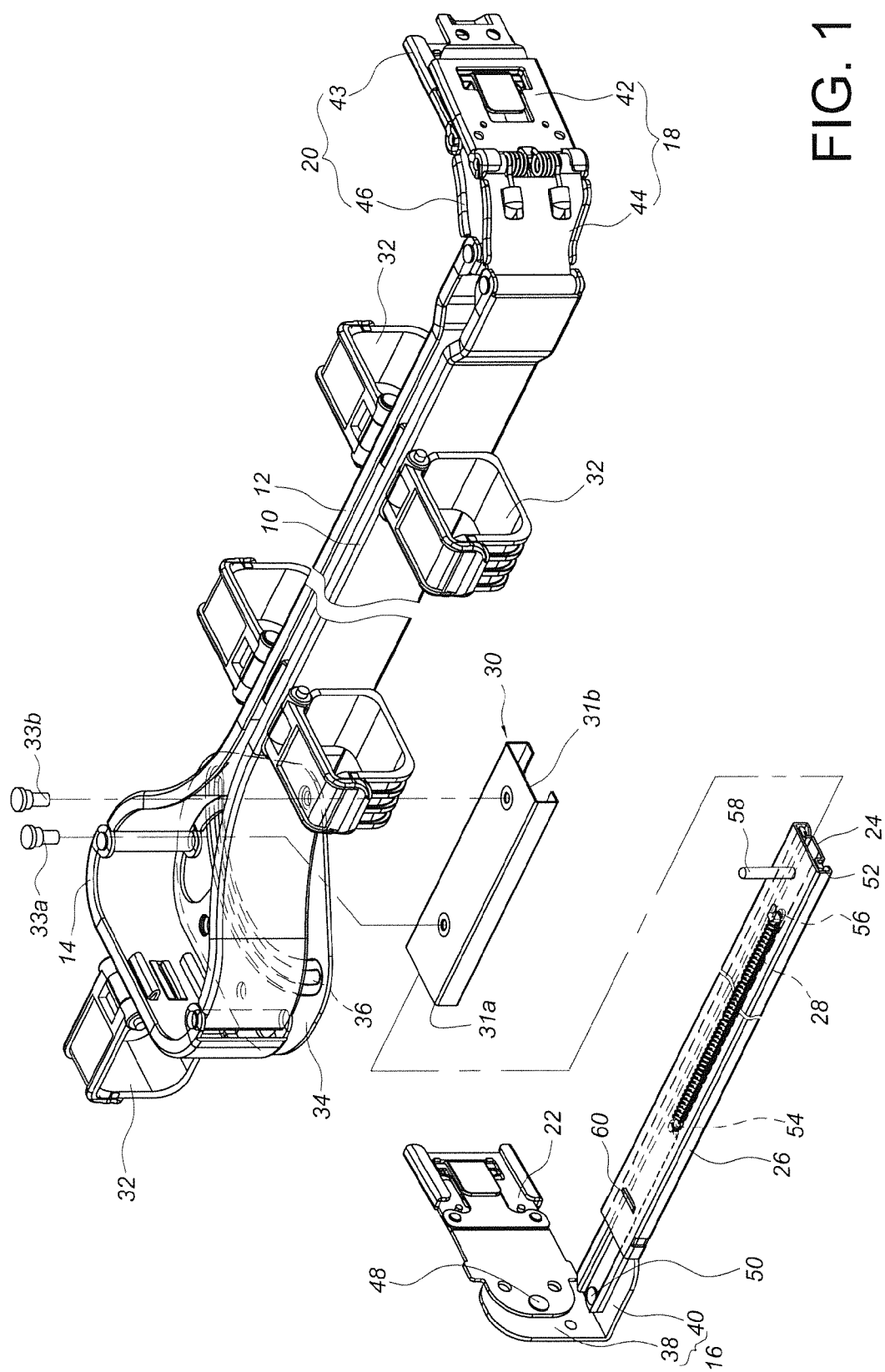
FIG. 1 is an exploded perspective view of an embodiment of the present invention.
Figure 2:
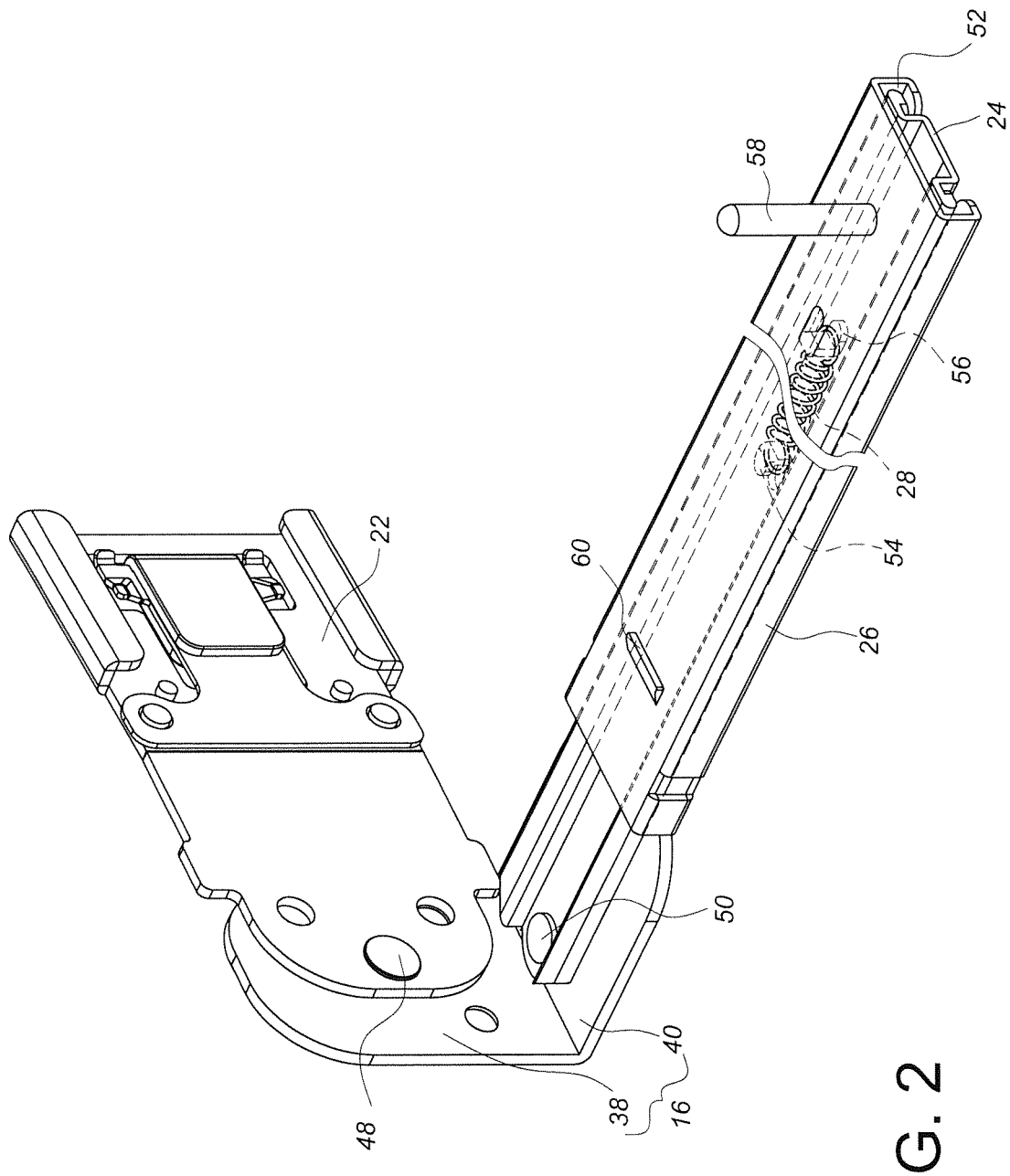
FIG. 2 is a partial view of the embodiment depicted in FIG. 1.

As shown in FIG. 1 and FIG. 2, the cable management arm assembly in one embodiment of the present invention includes a first arm 10, a second arm 12, a cable base 14, a supporting base 16, a first connecting unit 18, a second connecting unit 20, a third connecting unit 22, a first supporting member 24, a second supporting member 26, an elastic element 28, a sliding base 30, and a plurality of cable holders 32. The cable holders 32 are configured for holding cables (not shown) and are provided on the first arm 10, the second arm 12, and the cable base 14.

The cable base 14 is pivotally connected between the first arm 10 and the second arm 12. The cable base 14 includes a plate 34. In one preferred embodiment, the plate 34 is a separate component fixedly connected to the bottom of the cable base 14. Alternatively, the plate 34 is integrally formed with the cable base 14. Therefore, the plate 34 can be viewed as a portion of the cable base 14. In one preferred embodiment, the plate 34 has a curved sliding groove 36.

The supporting base 16 has a first supporting portion 38 and a second supporting portion 40 substantially perpendicular to the first supporting portion 38.

The first connecting unit 18 is connected to the first arm 10 and includes a first engaging base 42 and a first connecting base 44 pivotally connected to the first engaging base 42. In one preferred embodiment, the first connecting base 44 is pivotally connected to the first arm 10.

The second connecting unit 20 is connected to the second arm 12 and includes a second engaging base 43 and a second connecting base 46 pivotally connected to the second engaging base 43. In one preferred embodiment, the second connecting base 46 is pivotally connected to the second arm 12.

The third connecting unit 22 is pivotally connected to the first supporting portion 38 of the supporting base 16 via a first pivoting element 48.

The first supporting member 24 is pivotally connected to the second supporting portion 40 of the supporting base 16 via a second pivoting element 50. In addition, the first supporting member 24 abuts against the second supporting portion 40 of the supporting base 16.

The second supporting member 26 is movably connected to the first supporting member 24. More specifically, the second supporting member 26 has a channel 52, and the first supporting member 24 is disposed in the channel 52 such that the second supporting member 26 is displaceable relative to the first supporting member 24. In one preferred embodiment, the first supporting member 24 has a first hook 54, which preferably extends integrally from the first supporting member 24, and the second supporting member 26 has a second hook 56, which preferably extends integrally from the second supporting member 26. Moreover, the second supporting member 26 is provided with a first stop block 58 and a second stop block 60 at two ends respectively.

The elastic element 28 is connected to the first hook 54 of the first supporting member 24 and the second hook 56 of the second supporting member 26, so that the second supporting member 26 can be elastically pulled relative to the first supporting member 24 by the elastic element 28. In other words, the second supporting member 26 can be displaced relative to the first supporting member 24 in response to the elastic force generated by the elastic element 28. For example, the second supporting member 26 can be pulled relative to the first supporting member 24 from an extended state to a retracted state by the elastic force generated by the elastic element 28.

The sliding base 30 has a first end portion 31a and a second end portion 31b. A first connecting element 33a passes through the curved sliding groove 36 of the plate 34 and is connected adjacent to the first end portion 31a of the sliding base 30 so that the sliding base 30 can rotate relative to the plate 34 in a limited space defined by the curved sliding groove 36. Preferably, the second end portion 31b of the sliding base 30 is pivotally connected to the plate 34 via a second connecting element 33b. Further, the sliding base 30 is movably located between the first stop block 58 and the second stop block 60 of the second supporting member 26. It should be noted that, as stated above, the plate 34 can be viewed as a portion of the cable base 14, and so can the sliding base 30 connected to the cable base 14.

Figure 3:
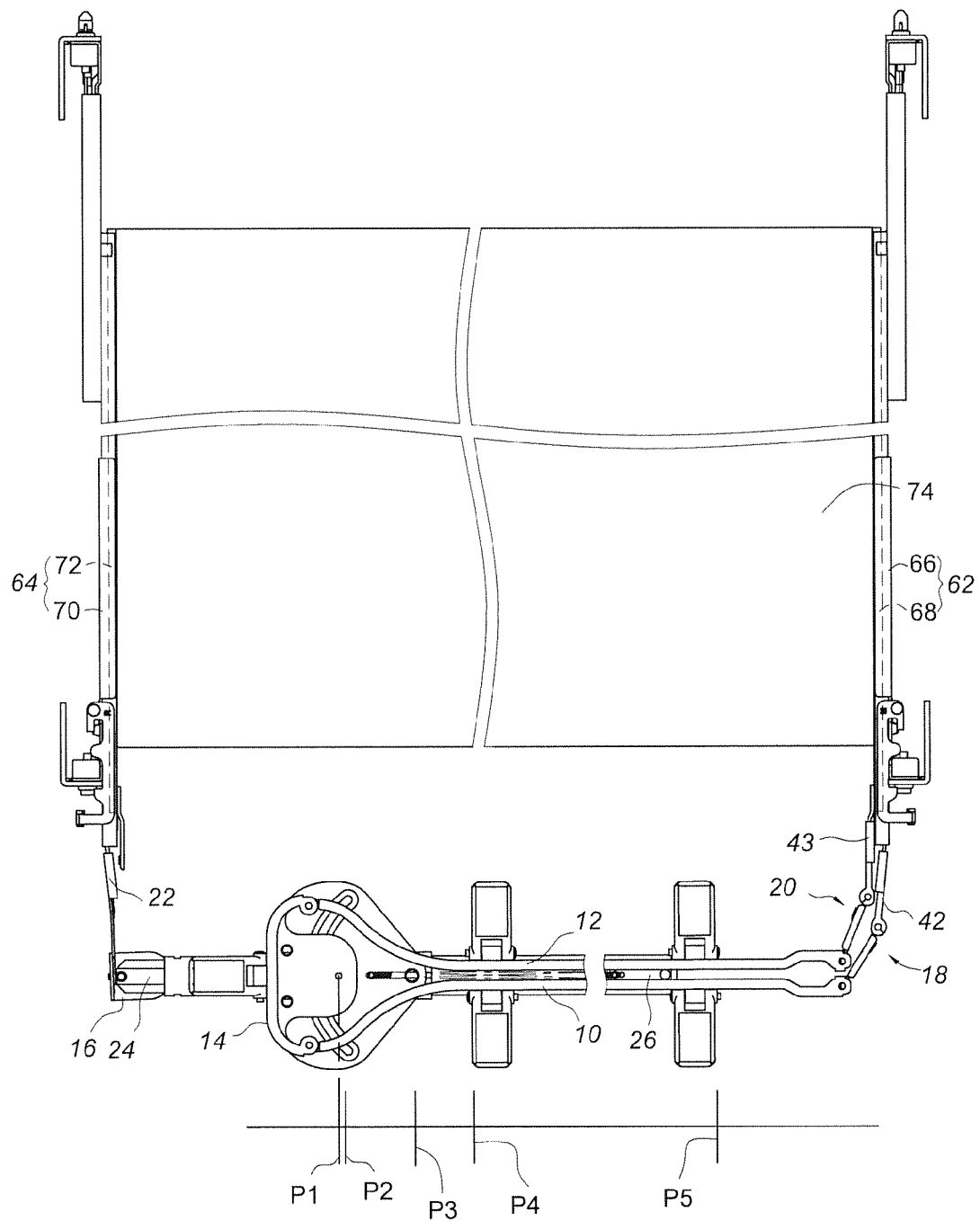
FIG. 3 is a schematic drawing in which the cable management arm assembly in the embodiment depicted in FIG. 1 is in a closed position.

In FIG. 3, the cable management arm assembly of the present invention is mounted on a first slide rail assembly 62 and a second slide rail assembly 64, which are provided in pairs. The first slide rail assembly 62 at least includes a first fixed rail 66 and a first movable rail 68, wherein the first movable rail 68 is longitudinally and slidably displaceable relative to the first fixed rail 66. Similarly, the second slide rail assembly 64 at least includes a second fixed rail 70 and a second movable rail 72, wherein the second movable rail 72 is longitudinally and slidably displaceable relative to the second fixed rail 70. A server apparatus 74 can be mounted on the first movable rail 68 of the first slide rail assembly 62 and the second movable rail 72 of the second slide rail assembly 64 and have its cables (not shown) arranged by means of the first arm 10, the second arm 12, and the cable base 14. The first arm 10 is connected to the first fixed rail 66 of the first slide rail assembly 62 via the first engaging base 42 of the first connecting unit 18 such that one end of the first arm 10 is fixed at a first predetermined position. The second arm 12 is connected to the first movable rail 68 of the first slide rail assembly 62 via the second engaging base 43 of the second connecting unit 20 such that one end of the second arm 12 is located at a second predetermined position. The second predetermined position is variable because the first movable rail 68 of the first slide rail assembly 62 can slide relative to the first fixed rail 66. The supporting base 16 is connected to the second fixed rail 70 of the second slide rail assembly 64 via the third connecting unit 22 and is thereby fixed at a third predetermined position.

When the first slide rail assembly 62 and the second slide rail assembly 64 are in the retracted state, as shown in FIG. 3, the second arm 12 and the first arm 10 are brought close to each other, forming a suspended member spanning a large distance. In this state, the center of gravity of the entire cable management arm assembly is located at P1. More specifically, the second supporting member 26 is retracted relative to the first supporting member 24, and the first supporting member 24 abuts against the supporting base 16. Therefore, when the first arm 10 and the second arm 12 are in a closed state in which they are close to each other, it is mainly the supporting base 16 that supports the cable management arm assembly; the load on the first connecting unit 18 and the second connecting unit 20 is relatively small.

Figure 4:
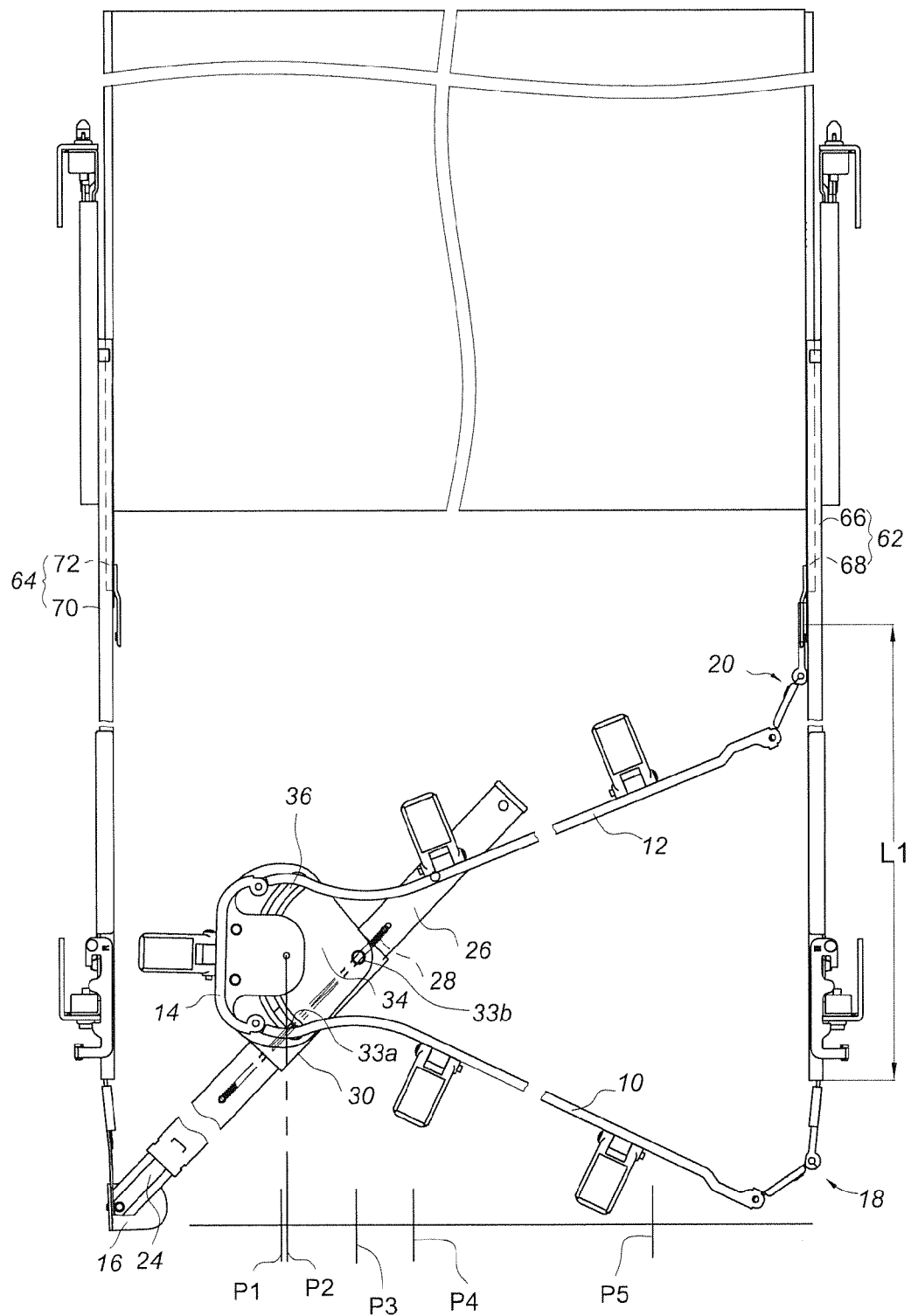
FIG. 4 is a schematic drawing in which the second connecting unit of the second arm in the embodiment depicted in FIG. 1 is spaced apart from the first connecting unit of the first arm by a first distance.

In FIG. 4, the first movable rail 68 of the first slide rail assembly 62 and the second movable rail 72 of the second slide rail assembly 64 have been pulled out preliminarily. As a result, the second connecting unit 20 of the second arm 12 is displaced relative to the first connecting unit 18 of the first arm 10 by a first distance L1. Limited by the elastic element 28, the second supporting member 26 in this state has yet to extend from the first supporting member 24. The cable base 14 and the plate 34, on the other hand, have slid linearly along the second supporting member 26 via the sliding base 30, and the cable base 14 has displaced in response to the displacement of the second arm 12. Through the sliding base 30 and the second supporting member 26, the cable base 14 has driven the first supporting member 24 to rotate relative to the supporting base 16. Meanwhile, due to the fact that the sliding base 30 is pivotally connected to the cable base 14 via the second connecting element 33*b*, the sliding base 30 itself has rotated relative to the cable base 14 and the plate 34 in a limited space defined by the curved sliding groove 36, thanks to the first connecting element 33*a*. In this state, the center of gravity of the entire cable management arm assembly is located at P2, with the supporting base 16 and the second supporting member 26 (together with the first supporting member 24) jointly providing effective support.

Figure 5:
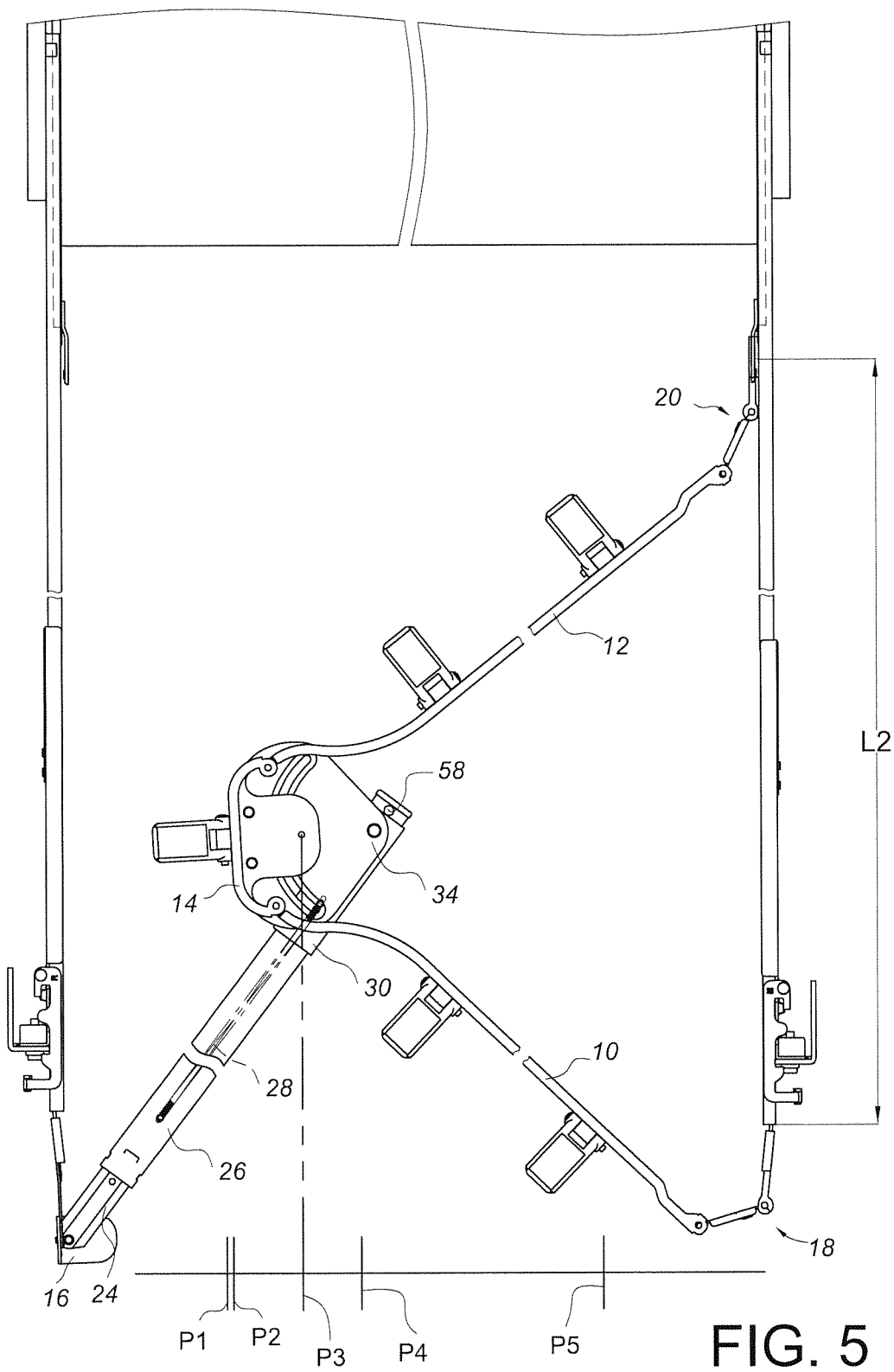
FIG. 5 is a schematic drawing in which the second connecting unit of the second arm in the embodiment depicted in FIG. 1 is spaced apart from the first connecting unit of the first arm by a second distance.

In FIG. 5, the second connecting unit 20 of the second arm 12 has been further displaced relative to the first connecting unit 18 of the first arm 10 such that the second connecting unit 20 is spaced from the first connecting unit 18 by a second distance L2. With the help of the sliding base 30, the cable base 14 and the plate 34 have slid along the second supporting member 26 to the first stop block 58, and after being stopped at the first stop block 58, the sliding base 30 has driven the second supporting member 26 to extend from the first supporting member 24 and has driven the first supporting member 24 to rotate relative to the supporting base 16. Meanwhile, the elastic element 28 is stretched by the second supporting member 26 and generates an elastic force for pulling back the second supporting member 26. The center of gravity of the entire cable management arm assembly in this state is situated at P3.

Figure 6:
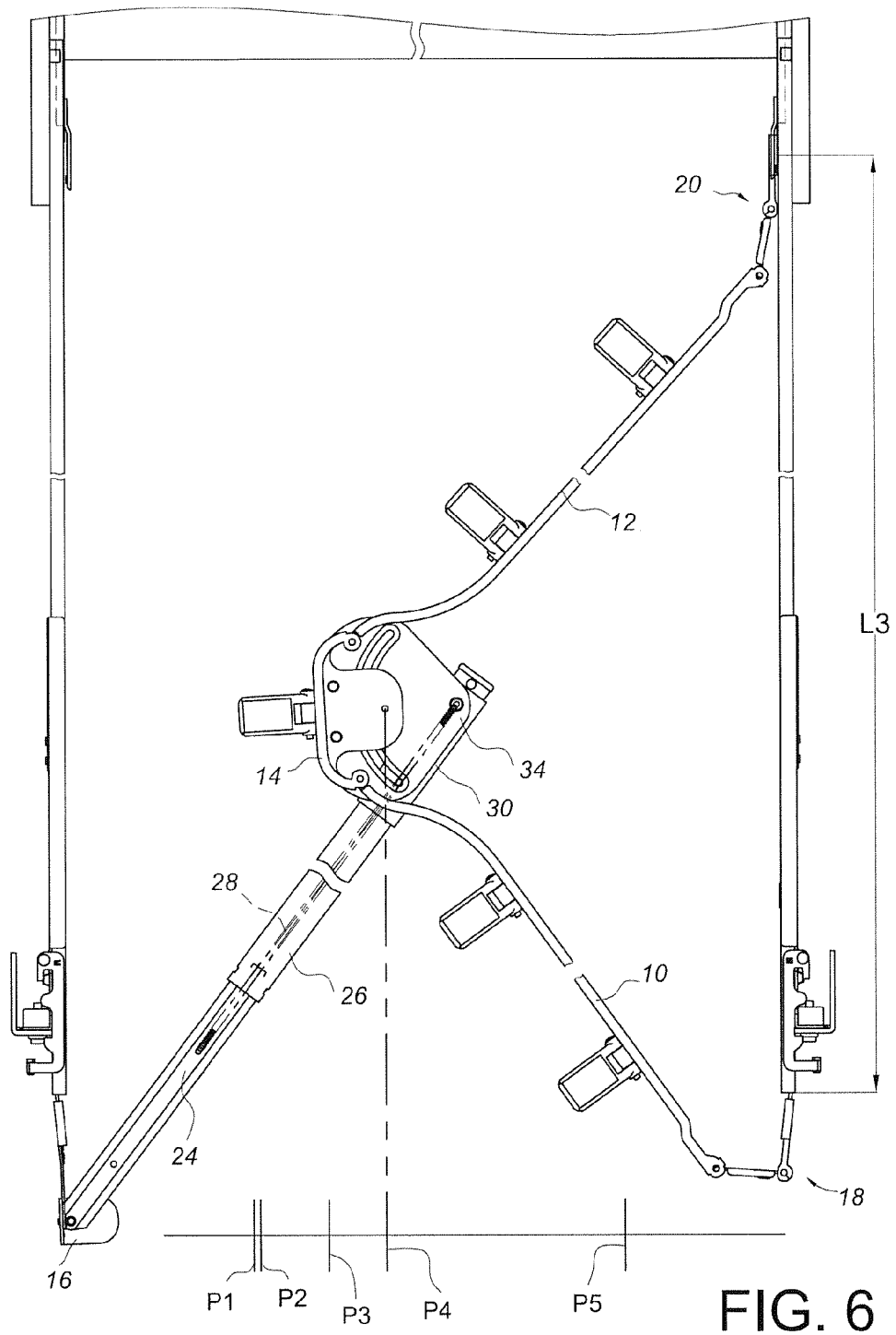
FIG. 6 is a schematic drawing in which the second connecting unit of the second arm in the embodiment depicted in FIG. 1 is spaced apart from the first connecting unit of the first arm by a third distance.

In FIG. 6, the second connecting unit 20 of the second arm 12 is spaced from the first connecting unit 18 of the first arm 10 by a third distance L3 after being further displaced relative to the first connecting unit 18. The cable base 14 and the plate 34 have, by means of the sliding base 30, driven the second supporting member 26 to extend further from the first supporting member 24 while the elastic element 28 continues applying an elastic force to the second supporting member 26. In this state, the center of gravity of the entire cable management arm assembly is located at P4, which is close to the center of the cable management arm assembly; therefore, the weight of the cable management arm assembly is jointly supported by the supporting base 16, the first connecting unit 18, and the second connecting unit 20.

Figure 7:
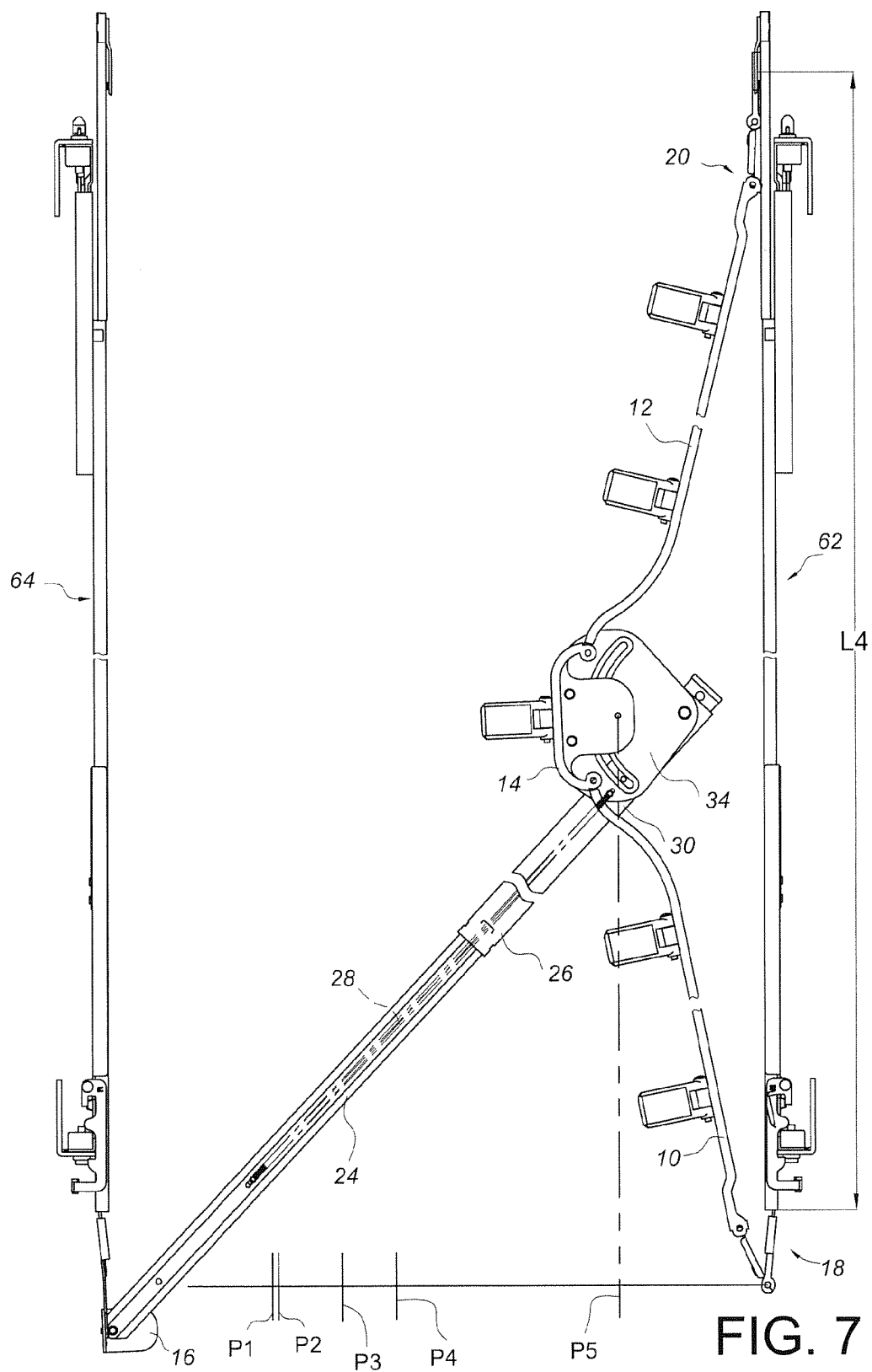
FIG. 7 is a schematic drawing in which the second connecting unit of the second arm in the embodiment depicted in FIG. 1 is spaced apart from the first connecting unit of the first arm by a fourth distance.

In FIG. 7, the second connecting unit 20 of the second arm 12 has been further displaced relative to the first connecting unit 18 of the first arm 10 to a fully extended position, where the second connecting unit 20 is spaced from the first connecting unit 18 by a fourth distance L4. The cable base 14 and the plate 34 have, by means of the sliding base 30, driven the second supporting member 26 to extend fully from the first supporting member 24, with the second supporting member 26 still subjected to the elastic force of the elastic element 28. In this state, the gravity center of the entire cable management arm assembly is located at P5, which is close to the first slide rail assembly 62. Consequently, most of the weight of the cable management arm assembly is jointly borne by the first connecting unit 18 and the second connecting unit 20.

It should be pointed out that, while the cable management arm assembly returns to the closed state, the second supporting member 26 is automatically pulled back relative to the first supporting member 24 due to the elastic force generated by the elastic element 28. The sliding base 30 will be displaced along the second supporting member 26 toward the supporting base 16, stop at the second stop block 60, and stay there until the second supporting member 26 is fully retracted relative to the first supporting member 24, i.e.; when the cable management arm assembly is fully closed.

Apart from being pivotally connected to the plate 34 in a rotatable configuration, the sliding base 30 may be directly fixed to the plate 34 of the cable base 14, provided that the length of the first arm 10 is extensible, allowing the sliding base 30 to slide along the second supporting member 26.

Figure 8:
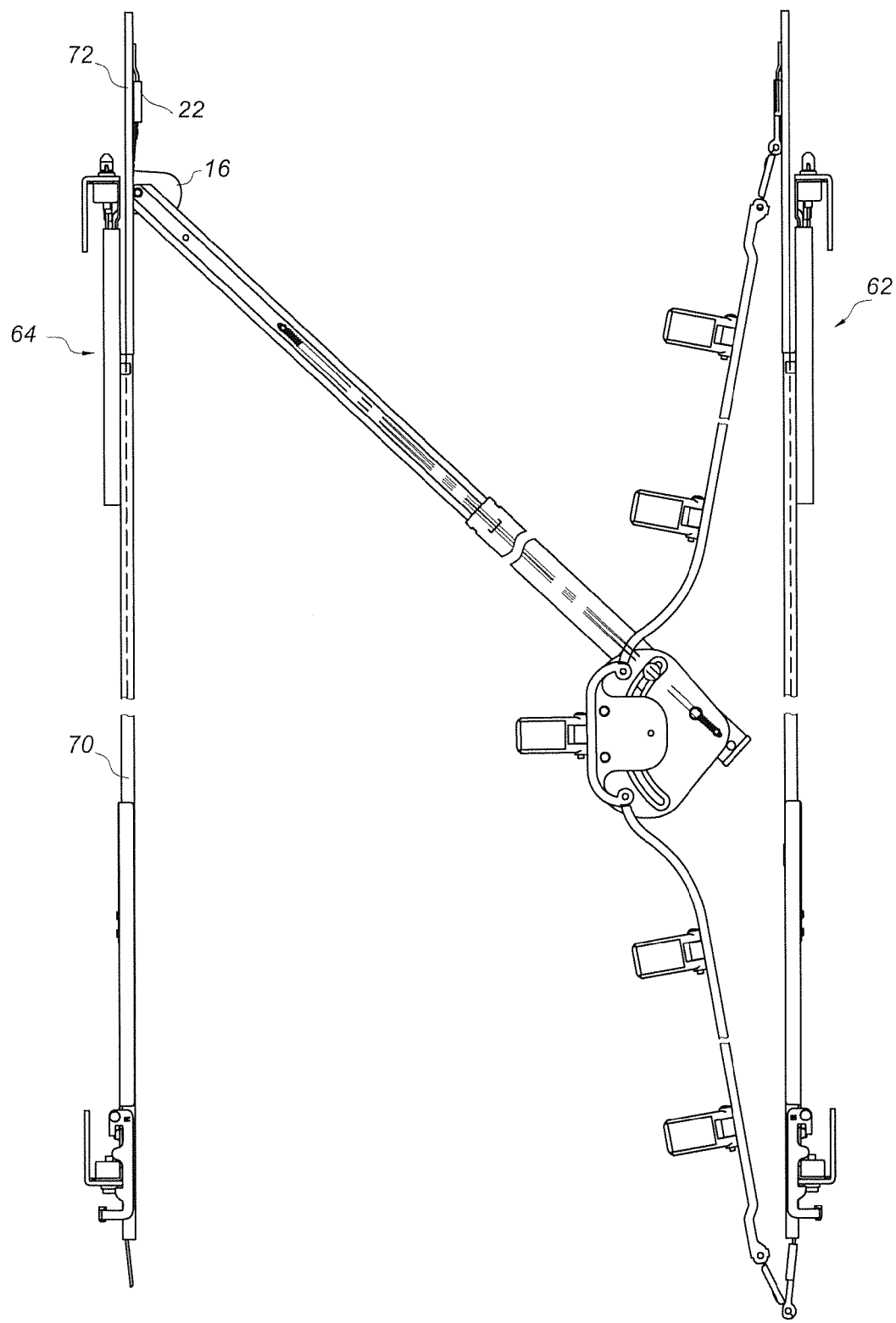
FIG. 8 is a schematic drawing in which the third connecting unit in the embodiment depicted in FIG. 1 is connected to the second movable rail of the second slide rail assembly.

In one preferred embodiment as shown in FIG. 8, the supporting base 16 is connected to the second movable rail 72 of the second slide rail assembly 64 via the third connecting unit 22. The working principle of the cable management arm assembly in this configuration is similar to when the third connecting unit 22 is connected to the second fixed rail 70 and therefore will not be stated repeatedly.

Figure 9:
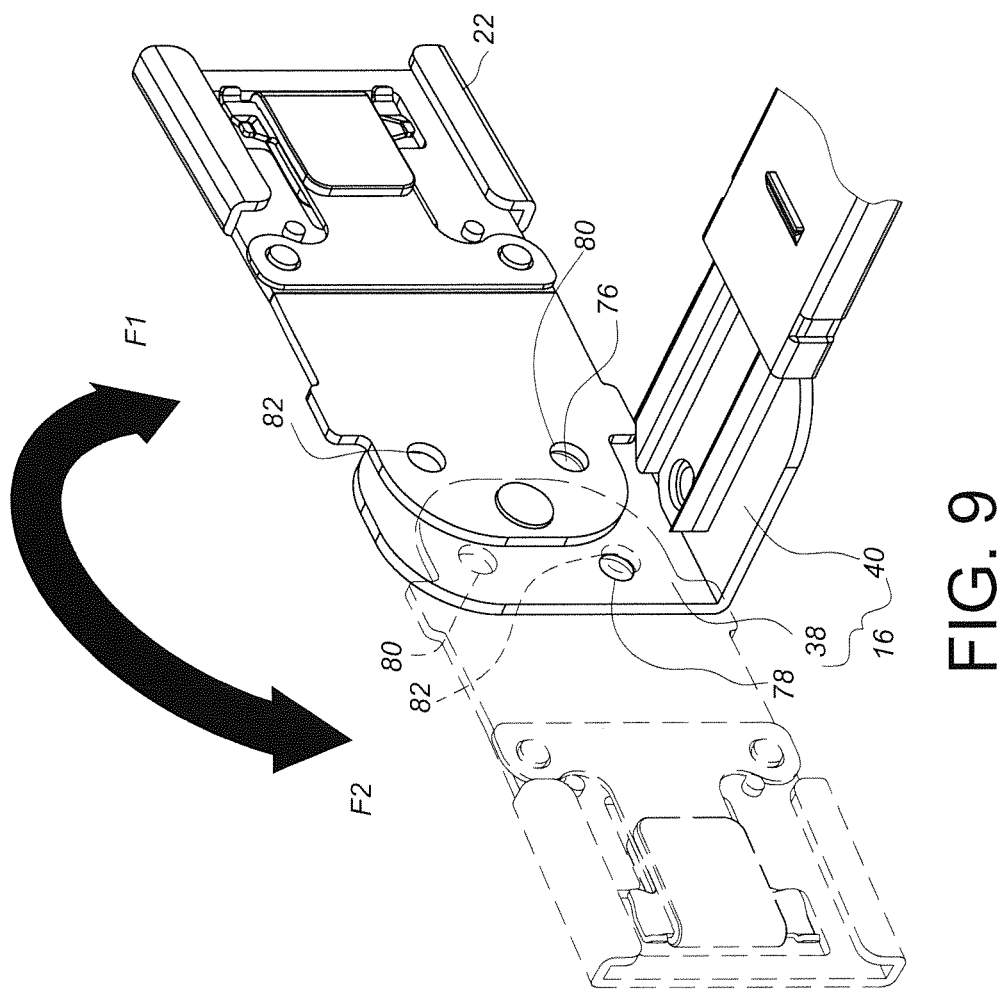
FIG. 9 shows that the third connecting unit in the embodiment depicted in FIG. 1 can be switched between different positions relative to the supporting base.

Referring to FIG. 9, the first supporting portion 38 of the supporting base 16 has a first projection 76 and a second projection 78, and the third connecting unit 22 has a first positioning hole 80 and a second positioning hole 82. When the third connecting unit 22 is rotated in a first direction F1 relative to the supporting base 16 to a first position, the first projection 76 of the third connecting unit 22 is engaged in the first positioning hole 80 to fix the third connecting unit 22 in position. When the third connecting unit 22 is rotated in a second direction F2 relative to the supporting base 16 to a second position, the second projection 78 of the third connecting unit 22 is engaged in the second positioning hole 82 to fix the third connecting unit 22 in position. This technical feature allows the cable management arm assembly to be used when laterally reversed.

As stated above, the cable management arm assembly of the present invention not only can provide stable static support when in the closed state, but also can redistribute its own weight between its components when extended to different degrees and thereby provide dynamic support. Hence, the cable management arm assembly will not sag excessively when loaded with cables.

It is understood that the preferred embodiments provided herein are intended only to demonstrate the present invention by way of example and should not be construed as restrictive of the scope of the present invention. The scope of the present invention is defined only by the appended claims.

The invention claimed is:

1. A cable management arm assembly comprising:
a first arm;
a second arm;
a cable base pivotally connected between the first arm and the second arm;
a plate fixedly connected to a bottom of the cable base;
a supporting base;
a first connecting unit connected to the first arm;
a second connecting unit connected to the second arm;
a third connecting unit connected to the supporting base;
a first supporting member pivotally connected to the supporting base and abutting against the supporting base;
a second supporting member movably connected to the first supporting member, the second supporting member being extensible and retractable relative to the first supporting member;
a sliding base connected to the plate and movably connected to the second supporting member; and
an elastic element connected between the first supporting member and the second supporting member so that the second supporting member can be elastically pulled relative to the first supporting member by the elastic element;
wherein the first arm is mounted at a fixed first predetermined position via the first connecting unit; the second arm is mounted at a variable second predetermined position via the second connecting unit; the supporting base is mounted at a fixed third predetermined position via the third connecting unit; and when the second connecting unit of the second arm is displaced away from the first connecting unit of the first arm, the cable base is moved away from the supporting base due to the sliding base sliding on the second supporting member, and the sliding base drives the second supporting member to extend relative to the first supporting member and drives the first supporting member to rotate relative to the supporting base.

2. A The cable management arm assembly comprising:
a first arm;
a second arm;
a cable base pivotally connected between the first arm and the second arm;
a plate fixedly connected to a bottom of the cable base;
a supporting base;
a first connecting unit connected to the first arm;
a second connecting unit connected to the second arm;
a third connecting unit connected to the supporting base;
a first supporting member pivotally connected to the supporting base and abutting against the supporting base;
a second supporting member movably connected to the first supporting member, the second supporting member being extensible and retractable relative to the first supporting member, the second supporting member having a first stop block and a second stop block; and
a sliding base connected to the plate and movably connected to the second supporting member, both said stop blocks corresponding in position to the sliding base so that the sliding base is slidable between the first stop block and the second stop block, and the sliding base, once stopped at the first stop block, drives the second supporting member to displace relative to the first supporting member;
wherein the first arm is mounted at a fixed first predetermined position via the first connecting unit; the second arm is mounted at a variable second predetermined position via the second connecting unit; the supporting base is mounted at a fixed third predetermined position via the third connecting unit; and when the second connecting unit of the second arm is displaced away from the first connecting unit of the first arm, the cable base is moved away from the supporting base due to the sliding base sliding on the second supporting member, and the sliding base drives the second supporting member to extend relative to the first supporting member and drives the first supporting member to rotate relative to the supporting base.

3. The cable management arm assembly of claim 1, wherein the first supporting member has a first hook, the second supporting member has a second hook, and the elastic element is connected to the first hook and the second hook.

4. A cable management arm assembly comprising:
a first arm;
a second arm;
a cable base pivotally connected between the first arm and the second arm;
a plate fixedly connected to a bottom of the cable base;
a supporting base, the supporting base having a first supporting portion and a second supporting portion substantially perpendicular to the first supporting portion;
a first connecting unit connected to the first arm;
a second connecting unit connected to the second arm;
a third connecting unit connected to the supporting base, the third connecting unit being pivotally connected to the first supporting portion;
a first supporting member pivotally connected to the supporting base and abutting against the supporting base, the first supporting member being pivotally connected to the second supporting portion;
a second supporting member movably connected to the first supporting member, the second supporting member being extensible and retractable relative to the first supporting member; and
a sliding base connected to the plate and movably connected to the second supporting member;

wherein the first arm is mounted at a fixed first predetermined position via the first connecting unit; the second arm is mounted at a variable second predetermined position via the second connecting unit; the supporting base is mounted at a fixed third predetermined position via the third connecting unit; and when the second connecting unit of the second arm is displaced away from the first connecting unit of the first arm, the cable base is moved away from the supporting base due to the sliding base sliding on the second supporting member, and the sliding base drives the second supporting member to extend relative to the first supporting member and drives the first supporting member to rotate relative to the supporting base.

5. The cable management arm assembly of claim 4, wherein the first supporting portion of the supporting base has a first projection and a second projection; the third connecting unit has a first positioning hole and a second positioning hole; when the third connecting unit is rotated in a first direction relative to the supporting base to a first position, the first projection of the third connecting unit is engaged in the first positioning hole to fix the third connecting unit in position; and when the third connecting unit is rotated in a second direction relative to the supporting base to a second position, the second projection of the third connecting unit is engaged in the second positioning hole to fix the third connecting unit in position.

6. The cable management arm assembly of claim 1, wherein the plate has a curved sliding groove, and the sliding base is connected to the curved sliding groove via a first connecting element so as to rotate relative to the plate in a limited manner.

7. The cable management arm assembly of claim 1, further comprising:
   a first slide rail assembly comprising a first fixed rail and a first movable rail longitudinally and slidably displaceable relative to the first fixed rail; and
   a second slide rail assembly comprising a second fixed rail and a second movable rail longitudinally and slidably displaceable relative to the second fixed rail;
wherein the first connecting unit is mounted on the first fixed rail of the first slide rail assembly to be fixed at the first predetermined position; the second connecting unit is mounted on the first movable rail of the first slide rail assembly to be located at the second predetermined position, the second predetermined position being variable in response to sliding of the first movable rail relative to the first fixed rail; and the third connecting unit is mounted on the second fixed rail of the second slide rail assembly and to be fixed at the third predetermined position.

8. A cable management system comprising:
   a first slide rail assembly comprising a first fixed rail and a first movable rail, the first movable rail being longitudinally slidable relative to the first fixed rail;
   a second slide rail assembly comprising a second fixed rail and a second movable rail, the second movable rail being longitudinally slidable relative to the second fixed rail;
   a first arm connected to the first fixed rail of the first slide rail assembly;
   a second arm connected to the first movable rail of the first slide rail assembly;
   a cable base pivotally connected between the first arm and the second arm;
   a supporting base connected to the second fixed rail of the second slide rail assembly;
   a first supporting member pivotally connected to the supporting base and abutting against the supporting base;
   a second supporting member movably connected to the first supporting member;
   an elastic element connected between the first supporting member and the second supporting member; and
   a sliding base connected to the cable base and slidably connected to the second supporting member;
wherein when the first slide rail assembly and the second slide rail assembly are extended, the second arm is displaced away from the first arm, the sliding base moves away from the supporting base by sliding on the second supporting member, and the sliding base drives the second supporting member to extend relative to the first supporting member and drives the first supporting member to rotate relative to the supporting base; and
wherein when the first slide rail assembly and the second slide rail assembly are retracted, the second arm is brought close to the first arm, and the second supporting member is displaced relative to the first supporting member in response to an elastic force generated by the elastic element.

\* \* \* \* \*